United States Patent [19]

Bartlett

[11] Patent Number: 5,432,440
[45] Date of Patent: Jul. 11, 1995

[54] DETECTION OF TRI-STATE LOGIC SIGNALS

[75] Inventor: Donald M. Bartlett, Fort Collins, Colo.

[73] Assignees: AT&T Global Information Solutions Company, Dayton, Ohio; Hyundai Electronics America, Milpitas, Calif.

[21] Appl. No.: 796,995

[22] Filed: Nov. 25, 1991

[51] Int. Cl.[6] .......................................... G01R 15/12
[52] U.S. Cl. .................. 324/158.1; 324/73.1
[58] Field of Search ............... 324/158 R, 73.1, 76.31, 324/133, 122, 158.1, 760, 765; 371/15.1, 22.4; 307/262, 350, 303.1, 303; 437/8; 257/40, 48

[56] References Cited

U.S. PATENT DOCUMENTS

| | | | |
|---|---|---|---|
| 3,051,848 | 8/1962 | Clark | 303/262 |
| 3,234,400 | 2/1966 | Hart | 307/262 |
| 3,831,089 | 8/1974 | Pearce | 324/122 |
| 3,965,417 | 6/1976 | Tompkins | 324/76.31 |
| 4,336,495 | 6/1982 | Hapke | 324/158 T |
| 4,339,710 | 7/1982 | Hapke | 324/73.1 |
| 4,398,146 | 8/1983 | Draheim et al. | 324/73.1 |
| 4,682,047 | 7/1987 | Von Sichart | 307/443 |
| 4,737,713 | 4/1988 | Danby et al. | 324/76.31 |
| 4,743,841 | 5/1988 | Takeuchi | 324/158 R |
| 4,763,184 | 8/1988 | Krieger et al. | 357/51 |
| 5,099,212 | 3/1992 | Nagaishi | 324/133 |
| 5,111,136 | 5/1992 | Kawashima | 324/158 R |
| 5,130,645 | 7/1992 | Levy | 324/158 R |
| 5,142,222 | 8/1992 | Tanaka et al. | 324/158 R |

*Primary Examiner*—Vinh Nguyen
*Attorney, Agent, or Firm*—James M. Stover; Gregory A. Welte; Douglas Foote

[57] ABSTRACT

The invention concerns utilization of a single pin on an integrated circuit for a dual purpose. First, the pin carries data in a normal manner. Second, the pin carries a test signal, which is used, for example, to trigger a testing circuit into action. The invention receives both the data signals and the test signal. The invention ignores the data signals, and responds only to the test signals.

8 Claims, 6 Drawing Sheets

5,432,440

DETECTION OF TRI-STATE LOGIC SIGNALS

The invention concerns apparatus for detecting a signal which lies outside the range of normal HIGH and LOW logic signals, thus allowing the discrimination of three logic states.

BACKGROUND OF THE INVENTION

In an integrated circuit (IC), it is sometimes desirable to include an on-board testing apparatus which runs a diagnostic test of other circuitry on the IC. A TEST signal, which is generated externally, must be delivered to the testing apparatus, in order to initiate the testing sequence. A connector pin of the IC must carry the TEST signal. However, it is not desirable to permanently dedicate one (or more) of the connector pins to this TEST signal, because (a) pins on ICs are expensive, (b) they are in demand for other functions, and (c) the diagnostic testing is performed infrequently, compared with the other functions for which the IC was designed, so that the dedicated pin would remain idle most of the time.

OBJECTS OF THE INVENTION

It is an object of the invention to provide an apparatus which can detect a TEST signal applied to a pin of an IC, yet allow the pin to also carry data in a normal manner.

SUMMARY OF THE INVENTION

In one form of the invention, a single pin feeds both the invention and other circuitry which normally processes data carried by the pin. When the pin delivers normal data signals, such as HIGH and LOW signals, the invention ignores these. However, when the pin delivers a specific signal, which is higher in voltage than a normal HIGH signal, the invention detects it, and initiates the testing sequence.

DETAILED DESCRIPTION OF THE INVENTION

Overview

Figure 1:
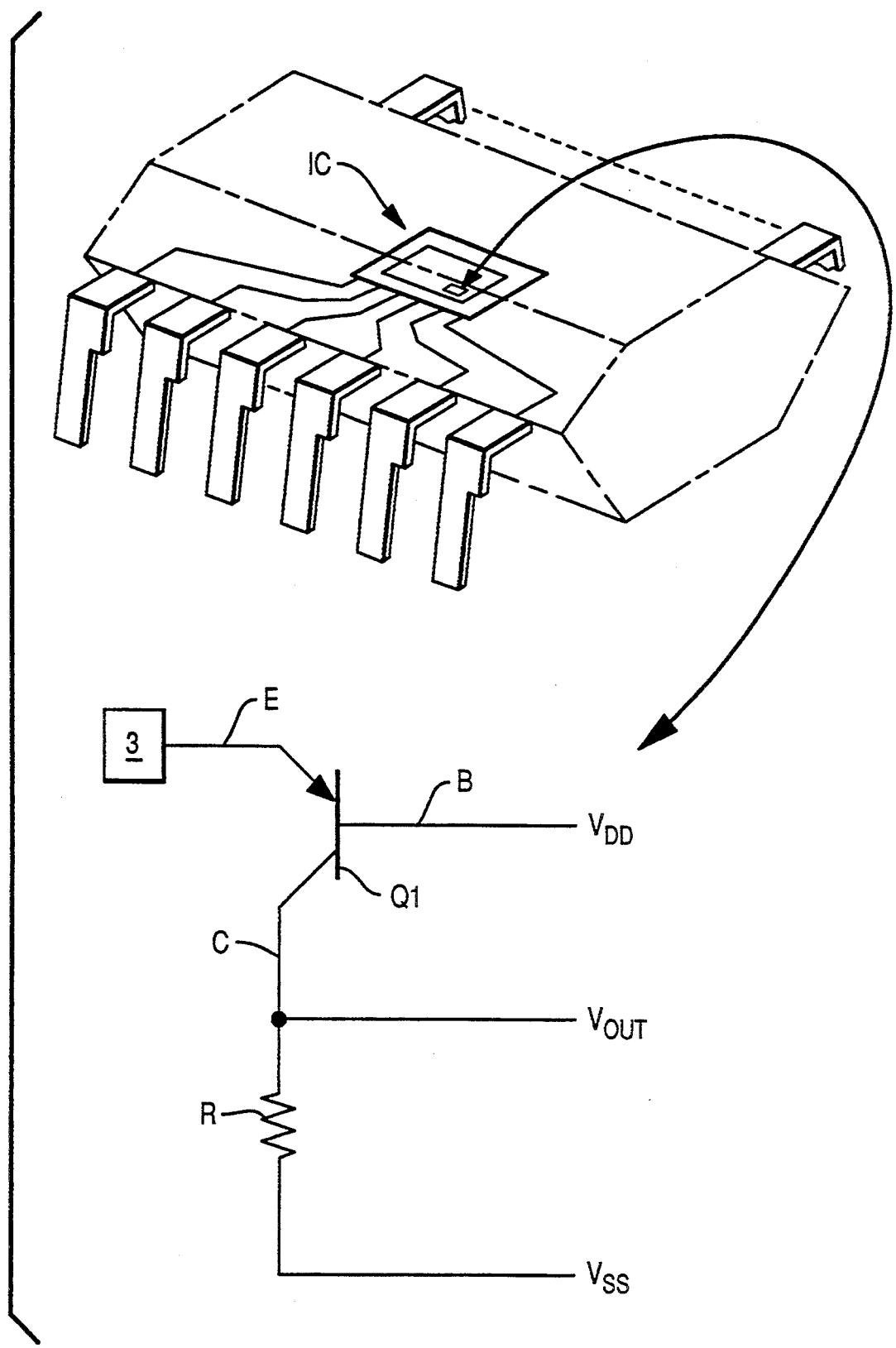
FIG. 1 illustrates a simplified form of the invention.

FIG. 1 shows a simplified form of the invention. Emitter E of transistor Q1 is connected to an input pad, or pin, 3 of the integrated circuit (IC). When the voltage at pin 3 is brought to a sufficiently high level above Vdd (for example, about 0.6 volts higher, 0.6 being the turn-on voltage of Q1), transistor Q1 goes into conduction and delivers a current to R. The current causes the voltage at Vout to rise. The voltage rise is detected by circuitry within the testing circuitry (not shown) which triggers a testing sequence into action.

However, if the voltage at pin 3 fails to reach this high level, as when ordinary HIGH and LOW logic signals are applied to pin 3, transistor Q1 fails to enter conduction, and Vout remains at, or near, zero volts.

Therefore, the apparatus of FIG. 1 ignores normal HIGH and LOW signals, and only responds to a "super-HIGH" signal, namely, one exceeding Vdd by the required amount. This discussion will consider the invention in more detail.

More Complex Form of Invention

Figure 2:
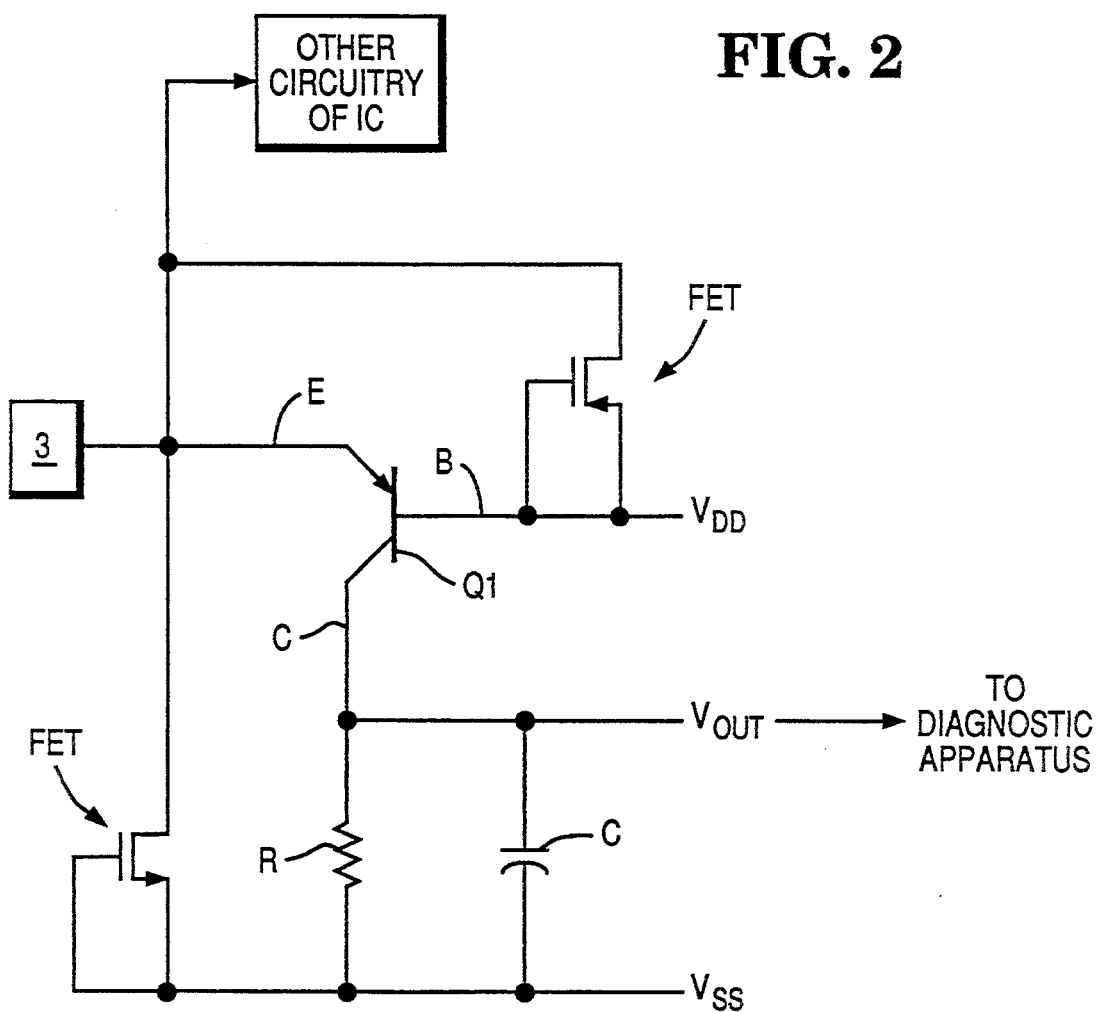
FIG. 2 illustrates a more complex form of the invention.

A more complex form of the invention is shown in FIG. 2. The FETs are configured as diodes, and act as protection against electrostatic discharge. That is, "static electricity" can cause a charge to be applied to the pin 3, which can apply a voltage to the emitter E, which can damage transistor Q1. The FET-diodes shunt the charge to either Vdd or Vss, depending upon whether the charge is positive or negative.

A capacitor C acts as a damper, or filter, for noise pulses which may appear at pin 3. That is, electrical noise will probably exist at pin 3, in the form of brief voltage spikes. These brief spikes can briefly drive Q1 into conduction, causing brief current pulses through R, causing brief voltage spikes on Vout. The capacitor C absorbs the current pulses which would otherwise traverse through resistor R. The small voltage rise in capacitor C, due to the absorbed charge, is dissipated by subsequent discharging through resistor R.

Capacitor C preferably has a value of 10 picoFarad, and resistor R preferably has a value of 100K ohms.

Significant Features of Invention

Figure 3:
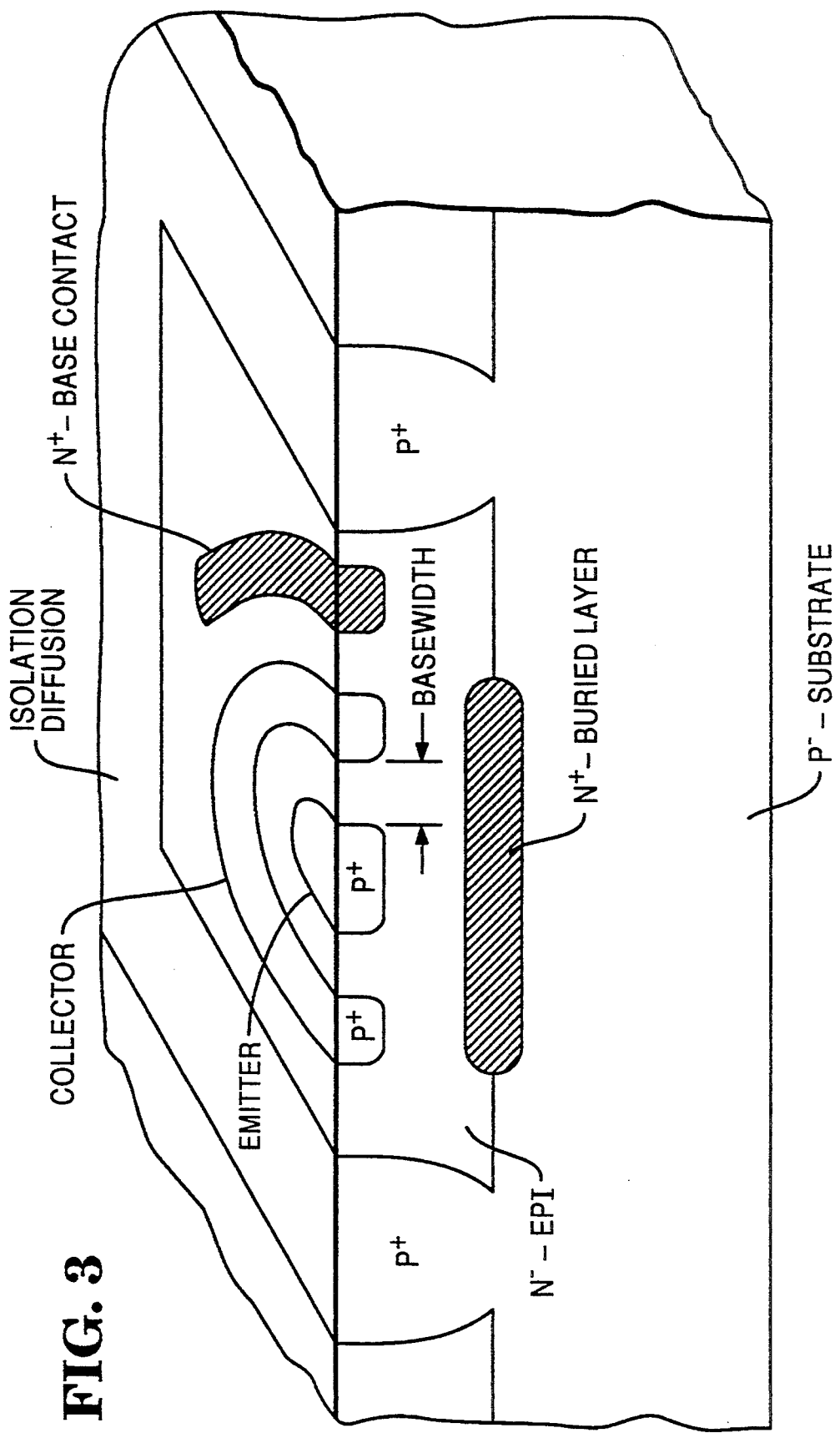
FIG. 3 illustrates a lateral PNP transistor.
Figure 4:
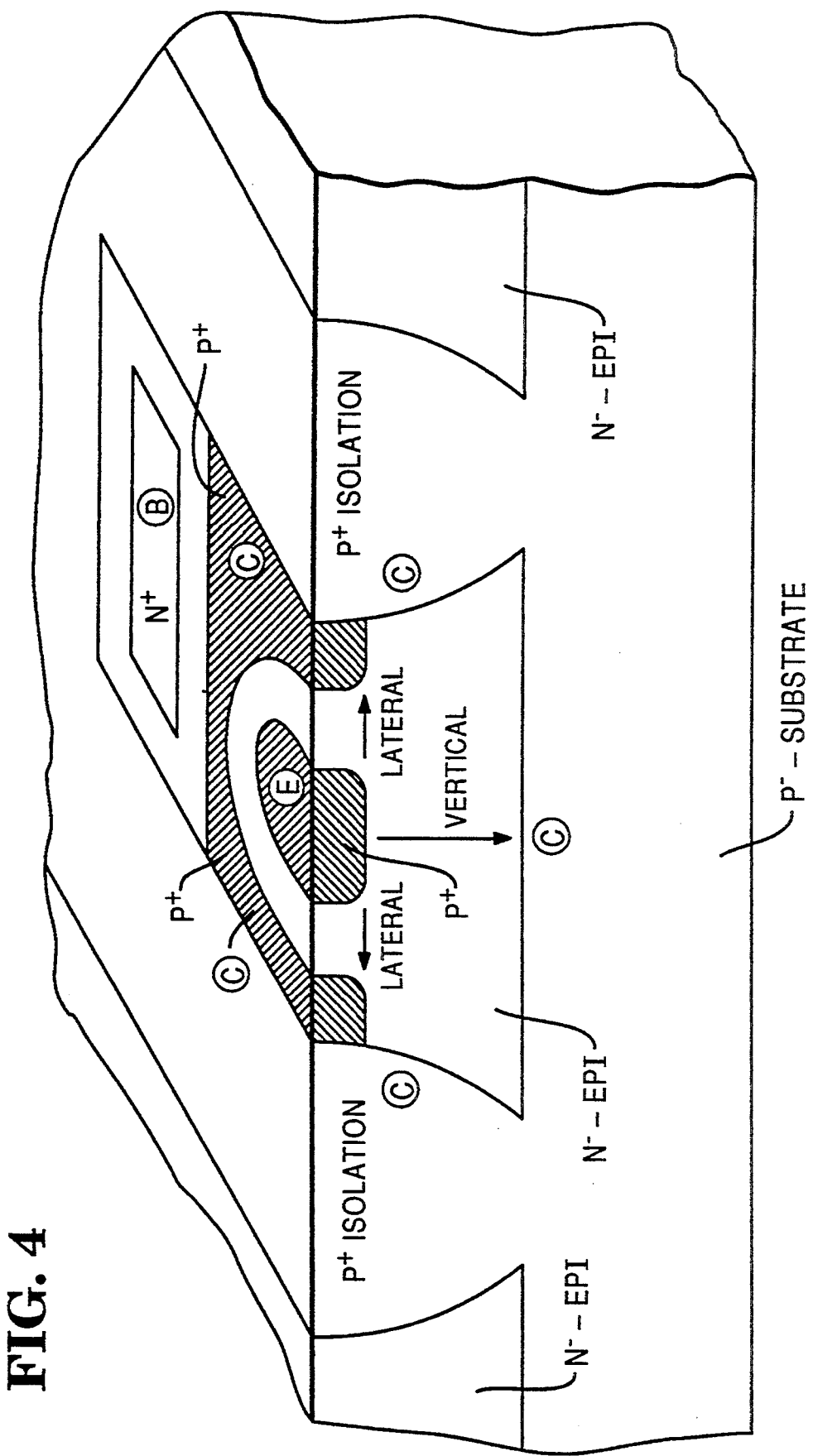
FIG. 4 illustrates a vertical PNP transistor.

1. The construction of transistor Q1 is significant. It is a lateral PNP structure, fabricated using CMOS (Complementary Metal Oxide Semiconductor) techniques. FIG. 3 shows a lateral PNP. A lateral PNP is different from a "vertical" PNP, one type of which is shown in FIG. 4. In a parasitic vertical PNP, the collector C is held at the same voltage potential as the substrate. Such a transistor could not be used in a straightforward manner for the invention, because, in such a case, Vout in FIG. 2 (which is connected to the collector C) would also be held at substrate potential. However, by using a lateral PNP, the collector is not held at substrate potential, as indicated in FIG. 3, but its voltage can float. Thus, the use of a lateral PNP transistor allows the collector C to rise in voltage above Vss, thus allowing a voltage drop to occur across resistor R.

Figure 5:
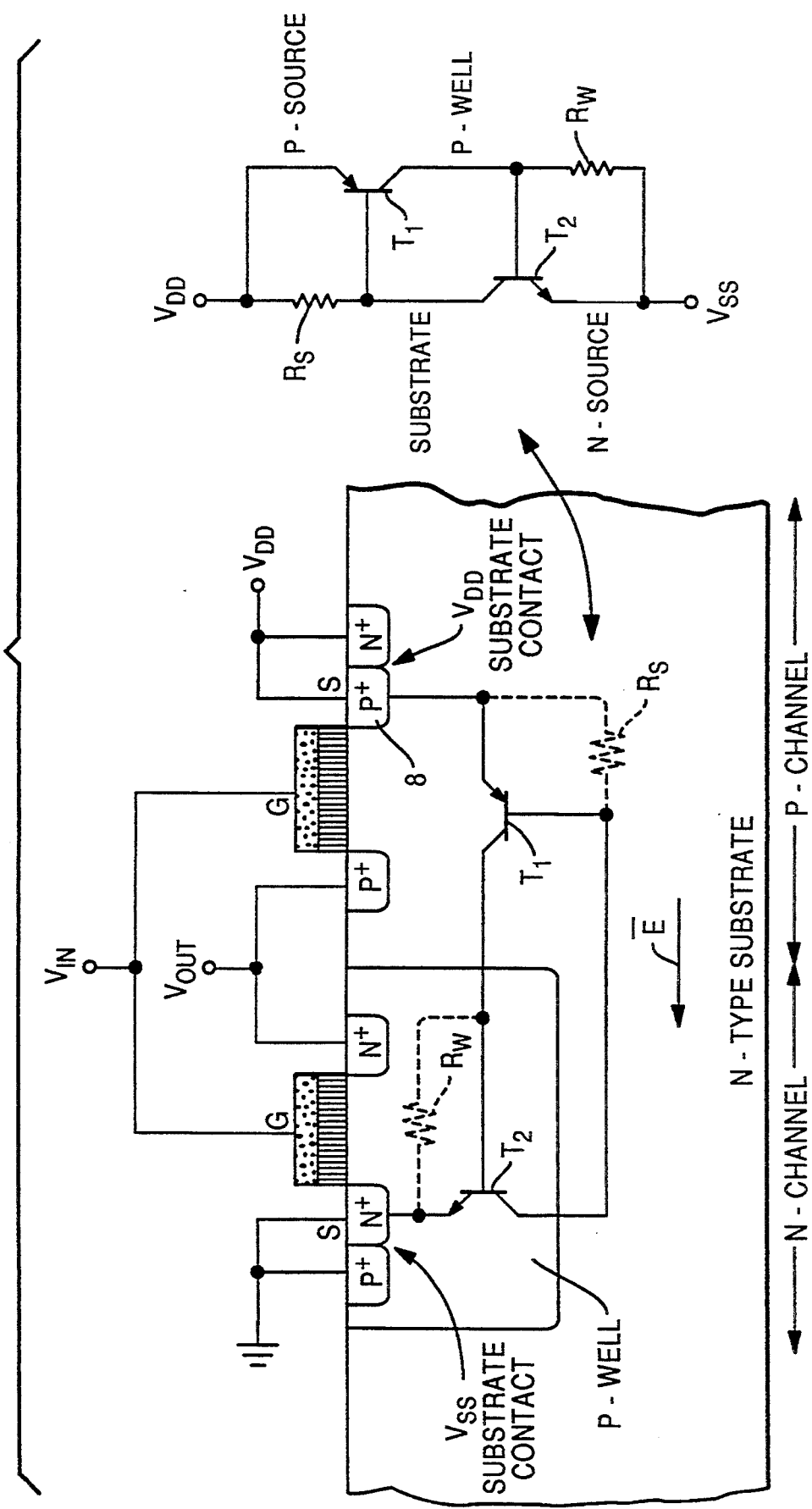
FIG. 5 illustrates parasitic transistors.

2. Transistor Q1 can be a "parasitic" transistor. That is, in CMOS devices, the p- and n-type diffusions, together with the p- or n-type substrate, form naturally occurring transistors, as shown in FIG. 5. (FIG. 5 shows a p-well process. The invention uses an n-well process, in which every component is complemented over that shown in FIG. 5.) Such transistors are termed "parasitic," because they are generally unwanted, and can cause problems. (One problem is "latch-up." In FIG. 5, transistors T1 and T2 can be accidentally biased into conduction, after which they are held in conduction by the bias voltages of Rs and Rw. The conducting transistors connect Vdd with Vss, and the connection resembles, to some extent, a short circuit between Vdd and Vss, which is undesirable.)

As a parasitic transistor, Q1 is a pre-existing structure, which would exist even in the absence of the invention. The invention salvages the pre-existing, and possibly unwanted, transistor by connecting it into the configuration shown in FIG. 2. (It is recognized that driving Q1 into conduction, by application of the super-HIGH signal, will probably disrupt the operation of the FET in FIG. 5. This disruption is acceptable, because, during testing, operation of the FET would be disrupted in any event.)

Q1 need not be a purely parasitic transistor. Some of the diffusions of Q1 can be shared by other components of the IC. For example, the emitter 7 in FIG. 3 can also be used as a source or drain 8 of an FET, as shown in FIG. 4.

3. Transistor Q1 in FIG. 1 need not be parasitic, but can be a dedicated lateral PNP type, with no other function other than to detect the super-HIGH TEST signal.

4. It is significant that the invention detects a super-HIGH signal having the following characteristic: it falls outside the range of voltages present on the IC during normal operation, namely outside the range of Vss to Vdd. It is believed that commonly available comparators would have difficulty detecting such a super-HIGH signal. However, in the invention, transistor Q1 acts as such a comparator, and compares the super-HIGH signal with Vdd. When the pin voltage exceeds (Vdd + $V_{Q1\ TURN\ ON}$), a voltage appears on Vout.

It is, of course, recognized that some ICs can have many different levels of Vdd and Vss, as well as other voltages applied to them, and that the super-HIGH signal need not fall outside the range of all these voltages. Instead, the super-HIGH signal must fall outside a particular range, namely, that of the data signals applied to pin 3.

Restated, the invention receives a pair of voltages (Vss and Vdd) which define a range outside which the normal data signals do not travel. When the invention does detect a signal outside the range, that signal is presumed to be a super-HIGH signal (provided that the signal persists for a sufficiently long time to charge capacitor C, and is not a noise spike.)

Figure 6:
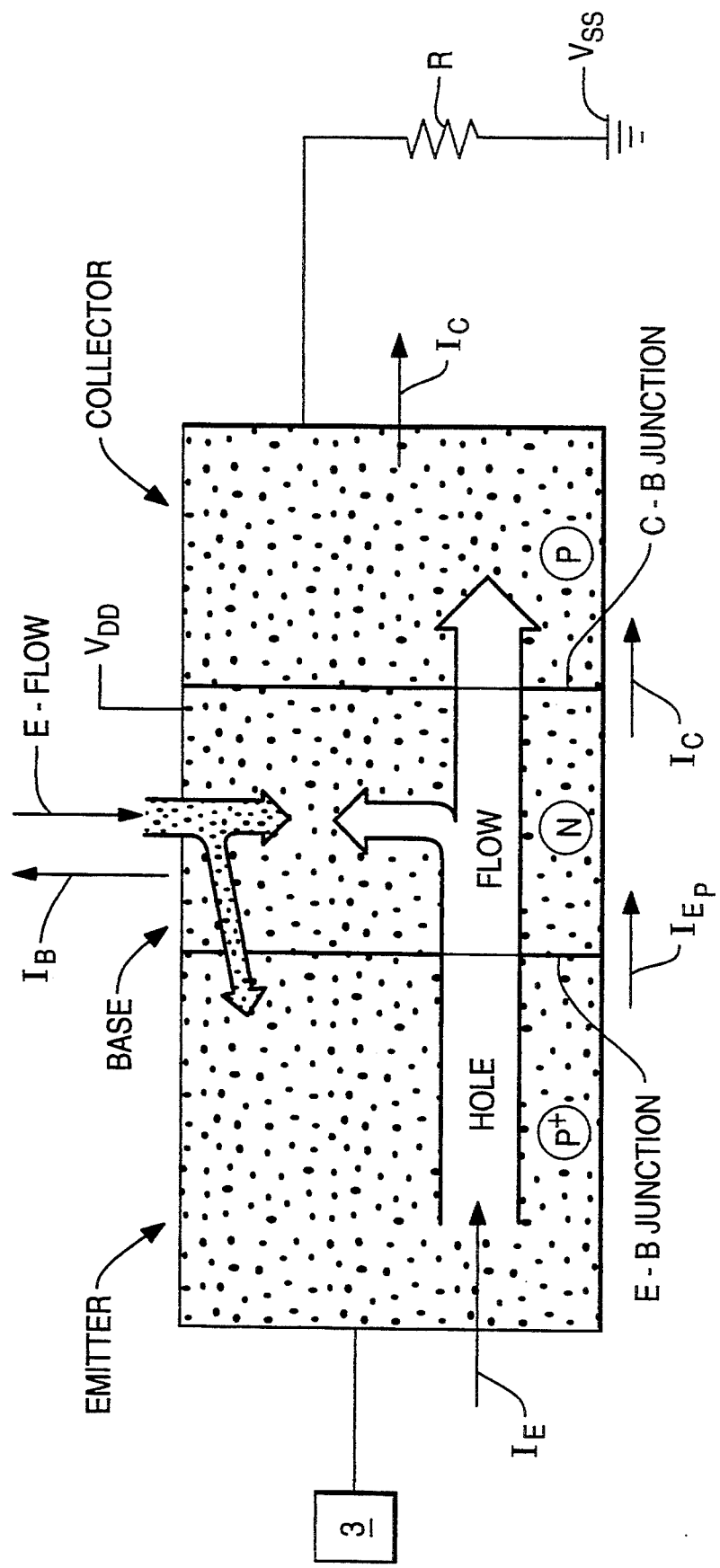
FIG. 6 illustrates the p-n junctions in Q1.

5. FIG. 6 shows a schematic of the PNP transistor Q1. In the absence of the super-HIGH signal, the collector-base (C-B) junction is reverse-biased by Vdd and Vss. At this time, the current through R is insignificant, being the reverse saturation current, which is of the order of pico-amps. However, when the super-HIGH signal is applied to pin 3, the emitter-base junction becomes forward-biased, injecting carriers into the C-B junction, which still remains reverse-biased. The carriers are swept across the C-B junction, and reach the resistor R. Now, the current through R is no longer insignificant.

Figure 7:
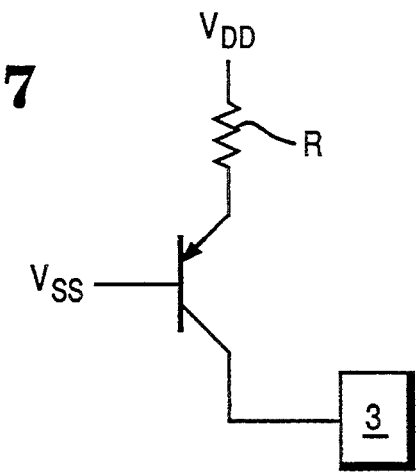
FIG. 7 illustrates how an NPN transistor can replace the PNP transistor of FIGS. 1 and 2.

6. A lateral PNP transistor is not strictly necessary. A lateral NPN transistor can be used, as when a p-well CMOS process is used. An NPN transistor would be configured as in FIG. 7, and would respond to super-LOW signals falling below Vss by a required amount. Lateral transistors are characterized by a low current gain, or Beta, $\beta$. A beta of 20 to 40 is acceptable.

7. Further detail concerning lateral transistors, parasitic transistors, and latch-up can be found in the following references. These references are hereby incorporated by reference, each in its entirety.

Thomas M. Frederiksen, *Intuitive IC Electronics*, 2d Ed., (McGraw-Hill, 1989) ISBN 0-07-021969-9, pp. 99–107 on lateral PNPs and vertical PNPs.

Richard C. Jaeger, *Introduction to Microelectronic Fabrication* (Addison-Wesley, 1990) ISBN 0-201-14695-9. p. 201 et seq on parasitics.

Ben G. Streetman, *Solid State Electronic Devices* (Prentice-Hall, 1972) ISBN 0-13-822023-9, p 372, 373 on laterals PNPs.

Neil Weste and Kamran Eshraghian, *Principles of CMOS VLSI Design*, (Addison-Wesley, 1988) ISBN 0-201-08222-5, p 58 et seq. on parasitics.

9. The signals normally received by pin 3 need not be binary signals. They can be analog signals, provided they remain within the range of Vdd and Vss in FIGS. 1 and 2 (otherwise, the analog signals would be mistakenly detected as super-HIGH signals).

10. The pin 3 serves a two-fold purpose. First, it normally carries signals to other parts of the IC, as indicated in FIG. 2. These signals can be enablement, addressing, data, or the other types of customary signals, and will collectively be called "data" signals herein, in order to distinguish over the power-supply pins, which do not, in general, carry "data." As stated above, these data signals need not be binary, but can be analog.

The pin also carries another type of signal, namely, the super-HIGH signal, or TEST signal, which lies outside the normal voltage limits of the data signals. Accordingly, the apparatus on the IC can be grouped into two types: one type responds to the data signals and ignores the super-HIGH signal; the other type (the testing circuitry) responds to the super-HIGH signal and ignores the data.

11. The diagnostic apparatus of FIG. 2, which is triggered into operation by the super-HIGH signal, is known in the art, and is not part of the invention.

Numerous substitutions and modifications can be undertaken without departing from the true spirit and scope of the invention. What is desired to be secured by Letters Patent is the invention as defined in the following claims.

I claim:

1. In an integrated circuit having a connector pin which receives voltage signals normally lying within a voltage range Vss to Vdd, apparatus for detecting signals which exceed Vdd, comprising:
   a) a reverse-biased PN junction and a resistor connected in series between a first voltage source providing voltage Vdd and a second voltage source providing voltage Vss; and
   b) means for injecting a current through the PN junction and the resistor, when a signal received at said connector pin exceeds Vdd, said current indicating the receipt of a signal which exceeds Vdd.

2. An integrated circuit, comprising:
   a) a connector pin for receiving
      i) HIGH and LOW signals; and
      ii) super-HIGH signals;
   b) first circuitry, connected to the pin, for receiving and responding to the HIGH and LOW signals;
   c) second circuitry, connected to the pin, for
      i) receiving the super-HIGH signals, and producing a signal in response; and
      ii) receiving and ignoring the HIGH and LOW signals.

3. In an integrated circuit, the improvement comprising:
   a) apparatus for receiving an input signal from a connector pin, and for
      i) providing no output signal if the input signal is either logic HIGH or LOW, and ii) providing an output signal when the input signal exceeds logic HIGH by a predetermined margin; and b) a filter for preventing the apparatus from providing an output signal in response to noise spikes on the connector pin.

4. In an integrated circuit, the improvement comprising:

a) a PNP transistor, connected such that
   i) its emitter is connected to a data pin of the IC;
   ii) its base is connected to a relatively high voltage; and
   iii) a resistor connects its collector to a relatively low voltage; and b) an output lead connected to the collector, for producing a signal when the voltage on the pin exceeds the relatively high voltage by a predetermined amount.

5. Apparatus according to claim 4 in which the PNP transistor is of the parasitic type.

6. Apparatus according to claim 4 in which the PNP transistor is of the lateral type.

7. Apparatus according to claim 4 and further comprising protection, connected to the emitter, for preventing electric charge applied to the pin from damaging the PNP transistor.

8. Apparatus according to claim 4 and further comprising a damper for dampening the effect of noise pulses presented to the emitter.

* * * * *